United States Patent
Kuo et al.

(10) Patent No.: US 10,972,094 B1
(45) Date of Patent: Apr. 6, 2021

(54) OPERATING CIRCUIT AND CONTROL METHOD

(71) Applicant: Quanta Computer Inc., Taoyuan (TW)

(72) Inventors: Hsin-Chih Kuo, Taoyuan (TW);
Chuan-Sheng Liao, Taoyuan (TW);
Yu-Chuan Shih, Taoyuan (TW);
Ming-Chieh Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/786,024

(22) Filed: Feb. 10, 2020

(30) Foreign Application Priority Data

Nov. 4, 2019 (TW) .................................. 108139843

(51) Int. Cl.
*H03K 17/687* (2006.01)
*H02J 4/00* (2006.01)

(52) U.S. Cl.
CPC ............ *H03K 17/6871* (2013.01); *H02J 4/00* (2013.01)

(58) Field of Classification Search
None
See application file for complete search history.

(56) References Cited

U.S. PATENT DOCUMENTS

| 8,253,277 | B2 | 8/2012 | Lin et al. | |
|---|---|---|---|---|
| 2013/0238910 | A1* | 9/2013 | Liu | H03K 17/693 713/300 |
| 2019/0027959 | A1* | 1/2019 | Lee | H02J 9/061 |

FOREIGN PATENT DOCUMENTS

TW 201121195 A 6/2011

OTHER PUBLICATIONS

Chinese language office action dated Aug. 21, 2020, issued in application No. TW 108139843.

* cited by examiner

*Primary Examiner* — Cassandra F Cox
(74) *Attorney, Agent, or Firm* — McClure, Qualey & Rodack, LLP

(57) ABSTRACT

An operating circuit including a system circuit and a power control circuit is provided. The system circuit operates according to the voltage of the node. The power control circuit includes a first connection port, a second connection port, a first always-on switch, a second always-on switch, a first current limiter, and a second current limiter. The first connection port is configured to receive first power provided by a first external device. The second connection port is configured to receive second power provided by a second external device. The first always-on switch is coupled to the first connection port to transmit the first power. The second always-on switch is coupled to the second connection port to transmit the second power. The first current limiter is coupled between the first always-on switch and the node. The second current limiter is coupled between the second always-on switch and the node.

19 Claims, 5 Drawing Sheets

US 10,972,094 B1

OPERATING CIRCUIT AND CONTROL METHOD

CROSS REFERENCE TO RELATED APPLICATIONS

This Application claims priority of Taiwan Patent Application No. 108139843, filed on Nov. 4, 2019, the entirety of which is incorporated by reference herein.

BACKGROUND OF THE INVENTION

Field of the Invention

The invention relates to an operating circuit, and more particularly to an operating circuit device that receive many sources of power.

Description of the Related Art

An electronic device will usually have a single power port to receive power from an external source. However, when the user forgets to bring along a charging cable, the electronic device cannot be charged. Additionally, even if the user inserts a charging cable into the electronic device, if the user suddenly removes the charging cable from the electronic device, the electronic device shuts down abruptly, which may damage the internal elements of the electronic device.

BRIEF SUMMARY OF THE INVENTION

In accordance with an embodiment, an operating circuit comprises a system circuit and a power control circuit. The system circuit operates according to the voltage of the node. The power control circuit comprises a first connection port, a second connection port, a first always-on switch, a second always-on switch, a first current limiter, and a second current limiter. The first connection port is configured to receive first power provided by a first external device. The second connection port is configured to receive second power provided by a second external device. The first always-on switch is coupled to the first connection port to transmit the first power. The second always-on switch is coupled to the second connection port to transmit the second power. The first current limiter is coupled between the first always-on switch and the node to provide the first power to the node. The second current limiter is coupled between the second always-on switch and the node to provide the second power to the node. In response to the first connection port being coupled to the first external device and the second connection port being coupled to the second external device, the system circuit communicates with the first and second external devices to obtain the features of the first power and the second power and directs the first always-on switch to stop transmitting the first power or directs the second always-on switch to stop transmitting the second power according to the features of the first power and the second power.

In accordance with a further embodiment, a control method comprises receiving first power from a first external device and utilizing a first always-on switch to transmit the first power to a node; receiving second power from a second external device and utilizing a second always-on switch to transmit the second power to the node; communicating the first and second external devices to obtain the features of the first power and the second power; and directing the first always-on switch to stop transmitting the first power or directing the second always-on switch to stop transmitting the second power according to the features of the first power and the second power.

Control methods may be practiced by the systems which have hardware or firmware capable of performing particular functions and may take the form of program code embodied in a tangible media. When the program code is loaded into and executed by an electronic device, a processor, a computer or a machine, the electronic device, the processor, the computer or the machine becomes an apparatus for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
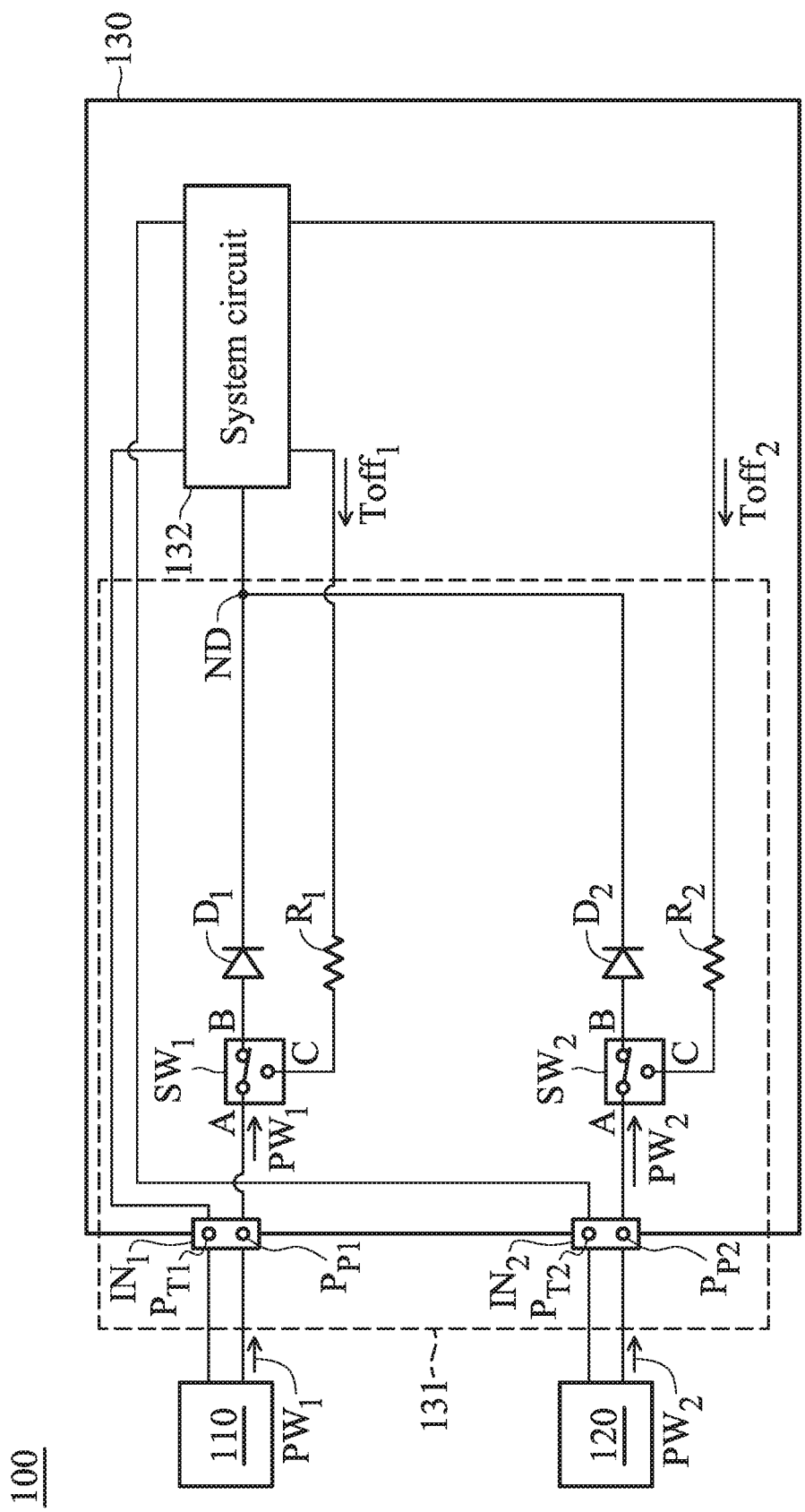
FIG. 1 is a schematic diagram of an exemplary embodiment of an operating system, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operating system, according to various aspects of the present disclosure. As shown in FIG. 1, the operating system 100 comprises external devices 110 and 120, and an operating circuit 130. The external device 110 is configured to provide power $PW_1$ to the operating circuit 130. The external device 120 is configured to provide power $PW_2$ to the operating circuit 130. In this embodiment, each of the power $PW_1$ and $PW_2$ is DC power. The invention is not limited to the kind of external devices 110 and 120. In one embodiment, the external devices 110 and 120 are AC to DC converters. In other embodiments, the external devices are DC converters.

The operating circuit 130 comprises a power control circuit 131 and a system circuit 132. The power control circuit 131 is configured to provide power to the system circuit 132. The system circuit 132 operates according to the power provided by the power control circuit 131. In this embodiment, the power provided by the power control circuit 131 is referred to as an operation power of the system circuit 132. As shown in FIG. 1, the power control circuit 131 comprises connection ports $IN_1$ and $IN_2$, always-on switches $SW_1$ and $SW_2$, and current limiters $D_1$ and $D_2$.

The connection port $IN_1$ comprises a power pin $P_{P1}$ configured to receive the power $PW_1$. The connection port $IN_2$ comprises a power pin $P_{P2}$ configured to receive the power $PW_2$. The invention is not limited to the kind of the connection ports $IN_1$ and $IN_2$. Taking the connection port $IN_1$ as an example, the connection port $IN_1$ is a USB Type-C port in one embodiment. In this case, the VBUS pin of the USB Type-C port serves as the power pin $P_{P1}$. In other embodiments, the connection port $IN_1$ is a USB Mini-A port, a USB Mini-B port, a USB Micro-A port or a USB Micro-B port. In such cases, the VBUS pin of the USB Mini-A port, the USB Mini-B port, the USB Micro-A port or the USB Micro-B port serves as the power pin $P_{P1}$.

In some embodiments, the connection port $IN_1$ further comprises a communication pin $P_{T1}$ and the connection port $IN_2$ further comprises a communication pin $P_{T2}$. The system circuit 132 communicates with the external device 110 via the communication pin $P_{T1}$ to obtain the features of the power $PW_1$, such as a voltage component and a current component. The system circuit 132 communicates with the external device 120 via the communication pin $P_{T2}$ to obtain the features of the power $PW_2$, such as a voltage component and a current component. The system circuit 132 generates the turn-off signals $Toff_1$ and $Toff_2$ according to the features of the power $PW_1$ and $PW_2$ to direct the power control circuit 131 to provide at least one of power $PW_1$ and power $PW_2$.

For example, when the voltage component of the power $PW_1$ is higher than the voltage component of the power $PW_2$ (e.g., the voltage component of the power $PW_1$ is 20V and the voltage component of the power $PW_2$ is 12V), the system circuit 132 directs the power control circuit 131 to provide the power $PW_1$. In another embodiment, when the current component of the power $PW_1$ is lower than the current component of the power $PW_2$ (e.g., the current component of the power $PW_1$ is 1A and the current component of the power $PW_2$ is 3A), the system circuit 132 directs the power control circuit 131 to provide the power $PW_2$. In other embodiments, when the voltage component of the power $PW_1$ is the same as the voltage component of the power $PW_2$, the system circuit 132 may direct the power control circuit 131 to provide both power $PW_1$ and power $PW_2$.

Since the power control circuit 131 comprises the connection ports $IN_1$ and $IN_2$, irrespective of the connection port $IN_1$ receives the power $PW_1$ or the connection port $IN_2$ receives the power $PW_2$, the system circuit 132 is capable of operating according to at least one of power $PW_1$ and power $PW_2$. Therefore, the convenience of the operating system 100 is increased.

The always-on switch $SW_1$ is coupled to the connection port $IN_1$ to transmit the power $PW_1$. The always-on switch $SW_2$ is coupled to the connection port $IN_2$ to transmit the power $PW_2$. Since the feature of the always-on switch $SW_1$ is the same as the feature of the always-on switch $SW_2$, the always-on switch $SW_1$ is given as an example to describe the operation of the always-on switch $SW_1$. As shown in FIG. 1, the always-on switch $SW_1$ comprises nodes A, B, and C. The node A is coupled to the power pin $P_{P1}$ of the connection port $IN_1$. The node B is coupled to the current limiter $D_1$. The node C receives the turn-off signal $Toff_1$. When the turn-off signal $Toff_1$ is not asserted, the node A connects to the node B. Therefore, when the external device 110 is coupled to the connection port $IN_1$, the always-on switch $SW_1$ transmits the power $PW_1$ to the current limiter $D_1$. When the turn-off signal $Toff_1$ is asserted, the node A connects to the node C. Therefore, the always-on switch $SW_1$ stops transmitting the power $PW_1$ to the current limiter $D_1$. In this embodiment, the node A always connects to the node B. Therefore, when the turn-off signal $Toff_1$ is not asserted, the always-on switch $SW_1$ always transmits the power $PW_1$ to the current limiter $D_1$.

Since the node A always connects to the node B, the always-on switches $SW_1$ and $SW_2$ always provide power to the system circuit 132 to maintain the operation of the system circuit 132. Additionally, the operating circuit 130 does not receive any enable signals from external devices and is capable of providing power to the system circuit 132.

The current limiter $D_1$ is coupled between the always-on switch $SW_1$ and the node ND to provide the power $PW_1$ to the node ND. In this embodiment, the current limiter $D_1$ is a diode to prevent the current of the node ND from feeding back to the always-on switch $SW_1$. The current limiter $D_2$ is coupled between the always-on switch $SW_2$ and the node ND to provide the power $PW_2$ to the node ND. In this embodiment, the current limiter $D_2$ is a diode to prevent the current of the node ND from feeding back to the always-on switch $SW_2$.

In other embodiments, the power control circuit 131 further comprises resistors $R_1$ and $R_2$. As shown in FIG. 1, the resistor $R_1$ is coupled between the always-on switch $SW_1$ and the system circuit 132 to transmit the turn-off signal $Toff_1$ to the always-on switch $SW_1$. The resistor $R_2$ is coupled between the always-on switch $SW_2$ and the system circuit 132 to transmit the turn-off signal $Toff_2$ to the always-on switch $SW_2$.

In this embodiment, the system circuit 132 controls the turn-off signals $Toff_1$ and $Toff_2$ according to the features of the power $PW_1$ and $PW_2$. For example, assuming the system circuit 132 communicates with the external devices 110 and 120 via the communication pins $P_{T1}$ and $P_{T2}$ to obtain that the power $PW_1$ is 15V/1A power and the power $PW_2$ is 12V/3A power. In such cases, since the voltage component of the power $PW_1$ is higher than the voltage component of the power $PW_2$, the system circuit 132 asserts the turn-off signal $Toff_2$. Therefore, the node A of the always-on switch $SW_2$ does not connect to the node B of the always-on switch $SW_2$ to stop transmitting the power $PW_2$ to the node ND. At this time, since the turn-off signal $Toff_1$ is not asserted, the node A of the always-on switch $SW_1$ still connects to the node B of the always-on switch $SW_1$. Therefore, the always-on switch $SW_1$ transmits the power $PW_1$ to the node ND. Since the predetermined state of the always-on switch is a short state, the always-on switch is capable of transmitting power continuously. No enable signal is provided to the always-on switch.

In another embodiment, since the current component of the power $PW_2$ is higher than the current component of the power $PW_1$, the system circuit 132 asserts the turn-off signal $Toff_1$. Therefore, the node A of the always-on switch $SW_1$ does not connect to the node B of the always-on switch $SW_1$ to stop transmitting the power $PW_1$ to the node ND. At this time, since the turn-off signal $Toff_2$ is not asserted, the node A of the always-on switch $SW_2$ connects to the node B of the always-on switch $SW_2$. Therefore, the always-on switch $SW_2$ transmits the power $PW_2$ to the node ND.

In other embodiments, assuming that the power $PW_1$ is 15V/1A power and the power $PW_2$ is 15V/3A power. In this case, the system circuit 132 may not assert the turn-off signals $Toff_1$ and $Toff_2$. Therefore, the always-on switches $SW_1$ and $SW_2$ transmit the power $PW_1$ and $PW_2$ to the node ND because the node A of the always-on switch $SW_1$ connects to the node B of the always-on switch $SW_1$ and the node A of the always-on switch $SW_2$ connects to the node B of the always-on switch $SW_2$.

Figure 2:
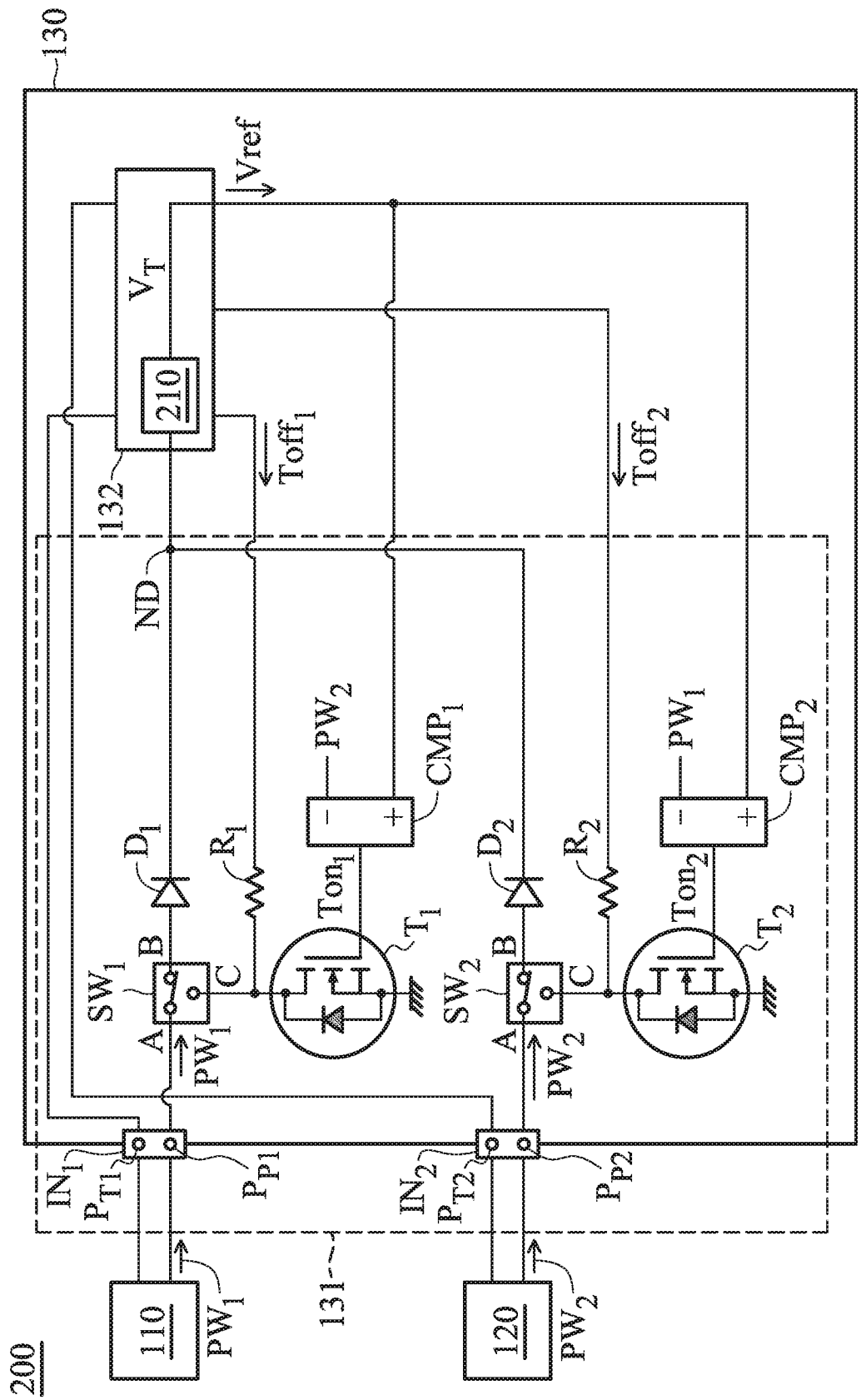
FIG. 2 is a schematic diagram of another exemplary embodiment of the operating system, according to various aspects of the present disclosure.

FIG. 2 is a schematic diagram of another exemplary embodiment of the operating system, according to various aspects of the present disclosure. FIG. 2 is similar to FIG. 1 exception that the power control circuit 121 shown in FIG. 2 further comprises switches $T_1$ and $T_2$ and inverter comparators $CMP_1$ and $CMP_2$. Additionally, the system circuit 132 of FIG. 2 comprises a voltage converter circuit 210. The voltage converter circuit 210 converts the voltage of the node ND to generate a converted voltage $V_T$. In this embodiment, the converted voltage $V_T$ serves as a reference voltage Vref. The structure of the voltage converter circuit 210 is not limited in the present disclosure. In one embodiment, the voltage converter circuit 210 is a DC-DC converter to increase or reduce the voltage of the node ND. In other embodiments, the voltage converter circuit 210 generates many converted voltages according to the voltage of the node ND and provides the converted voltages to different circuits.

The inverter comparator $CMP_1$ generates a turn-on signal $Ton_1$ according to the power $PW_2$ and the reference voltage Vref. In this embodiment, the inverter comparator $CMP_1$ compares the power $PW_2$ and the reference voltage Vref. When the power $PW_2$ is lower than the reference voltage Vref, it means that the external device 120 may be removed or the external device 120 works abnormally. Therefore, the inverter comparator $CMP_1$ asserts the turn-on signal $Ton_1$. When the power $PW_2$ is not lower than the reference voltage Vref, it means that the external device 120 is stably providing power. Therefore, the inverter comparator $CMP_1$ does not assert the turn-on signal $Ton_1$.

The switch $T_1$ controls the always-on switch $SW_1$ according to the turn-on signal $Ton_1$. For example, when the turn-on signal $Ton_1$ is asserted, it means that the power $PW_2$ is unstable. Therefore, the switch $T_1$ is turned on to direct the always-on switch $SW_1$ to enter a turn-on mode. In this embodiment, the node A of the always-on switch $SW_1$ connects to the node B of the always-on switch $SW_1$ to transmit the power $PW_1$ to the current limiter $D_1$. However, when the turn-on signal $Ton_1$ is not asserted, it means that the external device 120 is stably providing power. Therefore, the switch $T_1$ is turned off. At this time, the always-on switch $SW_1$ operates according to the turn-off signal $Toff_1$. For example, when the turn-off signal $Toff_1$ is asserted, it means that the system circuit 132 needs additional power. Therefore, the always-on switch $SW_1$ enters a turn-off mode according to the asserted turn-off signal $Toff_1$. In the turn-off mode, the node A of the always-on switch $SW_1$ does not connect to the node B of the always-on switch $SW_1$. Therefore, the always-on switch $SW_1$ stops transmitting the power $PW_1$ to the current limiter $D_1$. However, if the turn-off signal $Toff_1$ is not asserted, it means that the system circuit 132 needs the power $PW_1$. Therefore, the always-on switch $SW_1$ operates in a turn-on mode according to the un-asserted turn-off signal $Toff_1$. In the turn-on mode, the node A of the always-on switch $SW_1$ connects to the node B of the always-on switch $SW_1$ to continuously transmit the power $PW_1$ to the current limiter $D_1$. The kind of switch $T_1$ is not limited in the present disclosure. In one embodiment, the switch $T_1$ is an N-type transistor.

The inverter comparator $CMP_2$ generates a turn-on signal $Ton_2$ according to the power $PW_1$ and the reference voltage Vref. In this embodiment, the inverter comparator $CMP_2$ compares the power $PW_1$ and the reference voltage Vref. When the power $PW_1$ is lower than the reference voltage Vref, it means that the external device 110 may be removed or the external device 110 will work abnormally. Therefore, the inverter comparator $CMP_2$ asserts the turn-on signal $Ton_2$. When the power $PW_1$ is not lower than the reference voltage Vref, it means that the external device 110 is stably providing power. Therefore, the inverter comparator $CMP_2$ does not assert the turn-on signal $Ton_2$.

The switch $T_2$ controls the always-on switch $SW_2$ according to the turn-on signal $Ton_2$. Since the operation of switch $T_2$ is the same as the operation of switch $T_1$, the description of the operation of switch $T_2$ is omitted. Since the inverter comparators $CMP_1$ and $CMP_2$ monitor the power $PW_1$ and $PW_2$ respectively, when the power $PW_1$ or $PW_2$ is unstable or lower than a threshold (e.g., the reference voltage Vref), the inverter comparator $CMP_1$ or $CMP_2$ immediately directs the corresponding always-on switch to operate in a turn-on mode. In the turn-on mode, the always-on switch immediately transmits the corresponding power to stably provide power to the node ND to maintain the operation of the system circuit 132.

Figure 3:
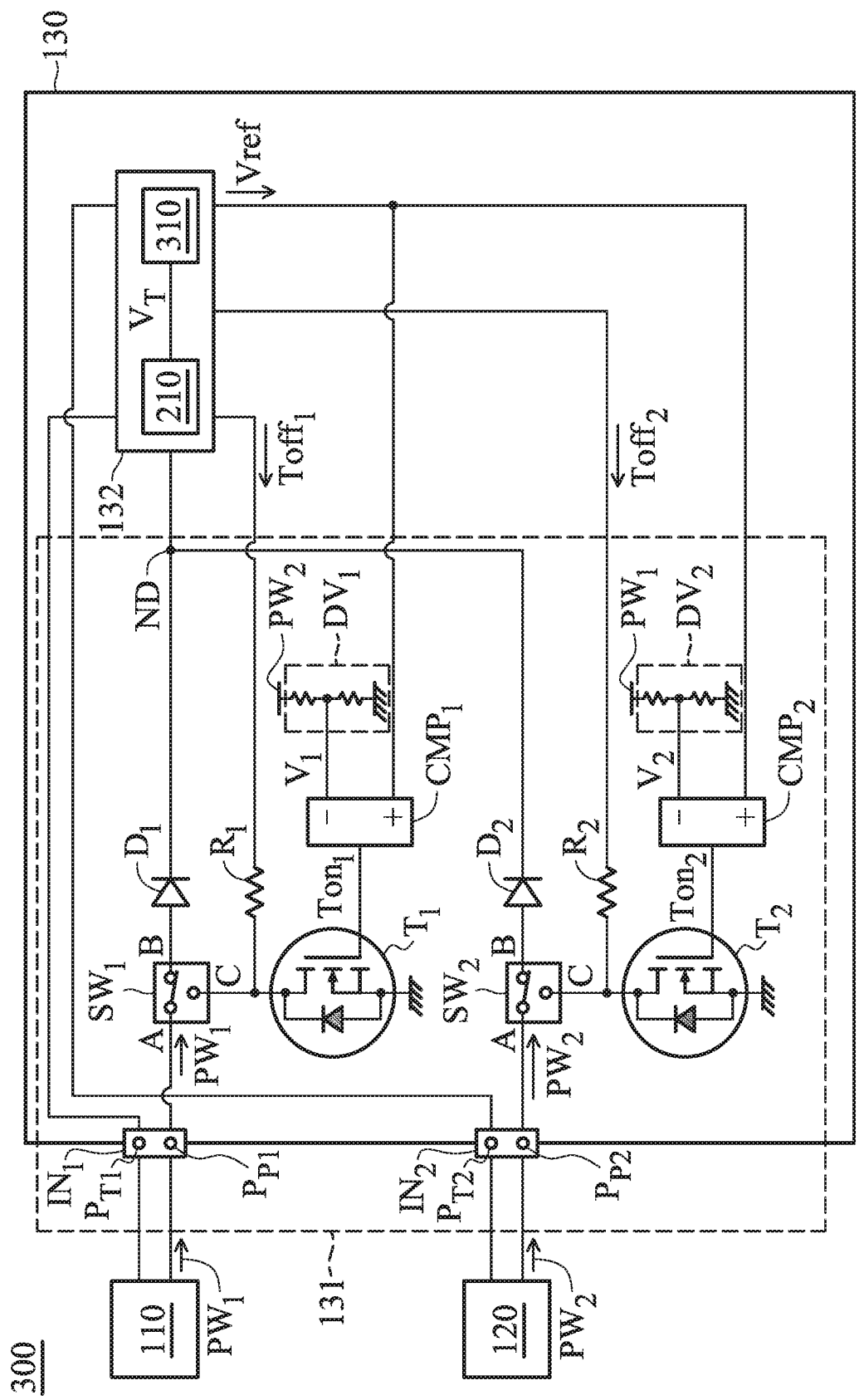
FIG. 3 is a schematic diagram of another exemplary embodiment of the operating system, according to various aspects of the present disclosure.

FIG. 3 is a schematic diagram of another exemplary embodiment of the operating system, according to various aspects of the present disclosure. FIG. 3 is similar to FIG. 2 exception that the power control circuit 131 shown in FIG. 3 further comprises voltage divider circuits $DV_1$ and $DV_2$.

The voltage divider circuit $DV_1$ processes the power $PW_2$ to generate a voltage $V_1$. The inverter comparator $CMP_1$ operates according to the voltage $V_1$. For example, when the voltage $V_1$ is lower than the reference voltage Vref, the inverter comparator $CMP_1$ asserts the turn-on signal $Ton_1$. At this time, the turn-on signal $Ton_1$ may be at a high level. When the voltage $V_1$ is not lower than the reference voltage Vref, the inverter comparator $CMP_1$ does not assert the turn-on signal $Ton_1$. At this time, the turn-on signal $Ton_1$ may be at a low level.

The voltage divider circuit $DV_2$ processes the power $PW_1$ to generate a voltage $V_2$. The inverter comparator $CMP_2$ operates according to the voltage $V_2$. Since the operation of the inverter comparator $CMP_2$ is the same as the operation of the inverter comparator $CMP_1$, the description of the operation of the inverter comparator $CMP_2$ is omitted.

In other embodiments, the system circuit 132 further comprises a voltage generating circuit 310. The voltage generating circuit 310 generates the reference voltage Vref according to the converted voltage $V_T$. The structure of the voltage generating circuit 310 is not limited in the present disclosure. In one embodiment, the voltage generating circuit 310 is a voltage divider circuit.

Figure 4:
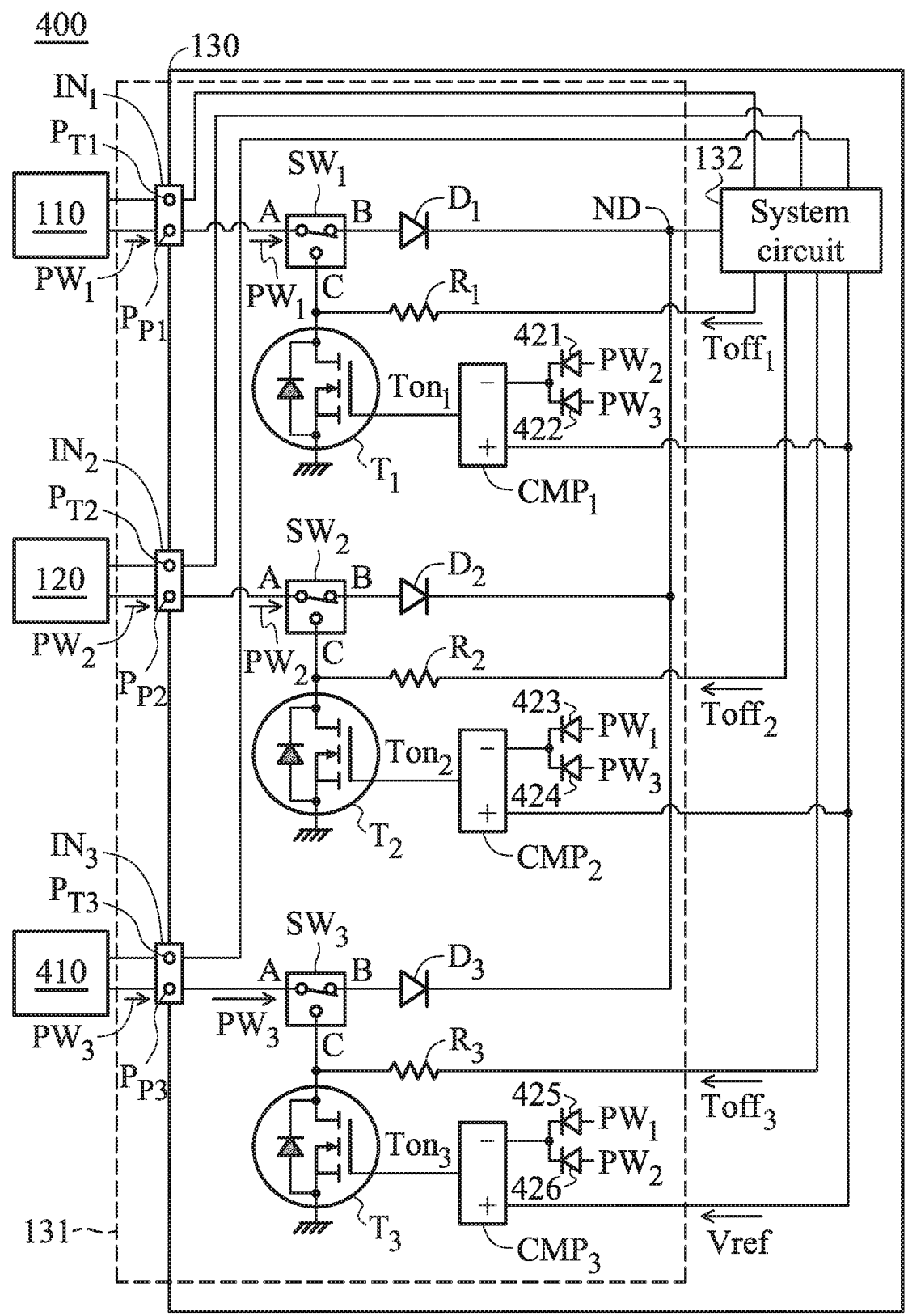
FIG. 4 is a schematic diagram of another exemplary embodiment of the operating system, according to various aspects of the present disclosure.

FIG. 4 is a schematic diagram of another exemplary embodiment of the operating system, according to various aspects of the present disclosure. FIG. 4 is similar to FIG. 2, exception that the operating system 400 of FIG. 4 further comprises an external device 410. The external device 410 is configured to provide power $PW_3$. Since the features of the external device 410 are the same as the features of the external device 110 shown in FIG. 2, the descriptions of the features of the external device 410 are omitted.

Additionally, in the embodiment, the power control circuit 131 further comprises a connection port $IN_3$, an always-on switch $SW_3$, current limiter $D_3$ and current limiters 421-426, a resistor $R_3$, a switch $T_3$, and an inverter comparator $CMP_3$. The number of connection ports in the power control circuit 131 is not limited in the present disclosure. When the power control circuit 131 comprises more connection ports, the power control circuit 131 is capable of receiving more power. Furthermore, the numbers of the always-on switches, the current limiters, the resistors, the switches and the inverter comparators are not limited in the present disclosure. In this embodiment, when the number of the connection ports is increased, the numbers of the always-on switches, the current limiters, the resistors, the switches and the inverter comparators are increased.

Since the operations of the connection port $IN_3$, the always-on switch $SW_3$, the current limiter $D_3$, the resistor $R_3$, the switch $T_3$, and the inverter comparator $CMP_3$ are the same as the operations of the connection port $IN_1$, the always-on switch $SW_1$, the current limiter $D_1$, the resistor $R_1$, the switch $T_1$, and the inverter comparator $CMP_1$ shown in FIG. 2, the descriptions of the operations of the connection port $IN_3$, the always-on switch $SW_3$, the current limiter $D_3$, the resistor $R_3$, the switch $T_3$, and the inverter comparator $CMP_3$ are omitted.

In this embodiment, the input of the current limiter 421 receives the power $PW_2$, and the output of the current limiter 421 is coupled to the inverted input of the inverter comparator $CMP_1$. Additionally, the input of the current limiter 422 receives the power $PW_3$, and the output of the current limiter 422 is coupled to the inverted input of the inverter comparator $CMP_1$. When the power $PW_2$ is higher than the power $PW_3$, the inverter comparator $CMP_1$ compares the power $PW_2$ and the reference voltage Vref to generate the turn-on signal $Ton_1$. When the power $PW_2$ is lower than the power $PW_3$, the inverter comparator $CMP_1$ compares the power $PW_3$ and the reference voltage Vref to generate the turn-on signal $Ton_1$. In other embodiments, when both the power $PW_2$ and the power $PW_3$ are lower than the reference voltage Vref, the inverter comparator $CMP_1$ asserts the turn-on signal $Ton_1$. In this embodiment, the current limiter 421 is configured to prevent the power $PW_3$ from feeding back to the external device 120, and the current limiter 422 is configured to avoid the power $PW_2$ feedback to the external device 410.

The input of the current limiter 423 receives the power $PW_1$, and the output of the current limiter 423 is coupled to the inverted input of the inverter comparator $CMP_2$. Additionally, the input of the current limiter 424 receives the power $PW_3$, and the output of the current limiter 424 is coupled to the inverted input of the inverter comparator $CMP_2$. When the power $PW_1$ is higher than the power $PW_3$, the inverter comparator $CMP_2$ compares the power $PW_1$ and the reference voltage Vref to generate the turn-on signal $Ton_2$. When the power $PW_1$ is lower than the power $PW_3$, the inverter comparator $CMP_2$ compares the power $PW_3$ and the reference voltage Vref to generate the turn-on signal $Ton_2$. In other embodiments, when both the power $PW_1$ and the power $PW_3$ are lower than the reference voltage Vref, the inverter comparator $CMP_2$ asserts the turn-on signal $Ton_2$. In this embodiment, the current limiter 423 is configured to avoid the power $PW_3$ feedback to the external device 110, and the current limiter 424 is configured to avoid the power $PW_1$ feedback to the external device 410.

The input of the current limiter 425 receives the power $PW_1$, and the output of the current limiter 425 is coupled to the inverted input of the inverter comparator $CMP_3$. Additionally, the input of the current limiter 426 receives the power $PW_2$, and the output of the current limiter 426 is coupled to the inverted input of the inverter comparator $CMP_3$. When the power $PW_1$ is higher than the power $PW_2$, the inverter comparator $CMP_3$ compares the power $PW_1$ and the reference voltage Vref to generate the turn-on signal $Ton_1$. When the power $PW_1$ is lower than the power $PW_2$, the inverter comparator $CMP_3$ compares the power $PW_2$ and the reference voltage Vref to generate the turn-on signal $Ton_3$. In other embodiments, when both the power $PW_1$ and the power $PW_2$ are lower than the reference voltage Vref, the inverter comparator $CMP_3$ asserts the turn-on signal $Ton_3$. In this embodiment, the current limiter 425 is configured to avoid the power $PW_2$ feedback to the external device 110, and the current limiter 426 is configured to avoid the power $PW_1$ feedback to the external device 120.

In other embodiments, the outputs of the current limiters 421 and 422 are coupled to a first voltage divider circuit (not shown). The first voltage divider circuit divides the voltage of the output of the current limiter 421 or 422 to generate a first voltage to the inverted input of the inverter comparator $CMP_1$. When the first voltage is lower than the reference voltage Vref, the inverter comparator $CMP_1$ asserts the turn-on signal $Ton_1$.

Similarly, the outputs of the current limiters 423 and 424 may be coupled to a second voltage divider circuit (not shown). The second voltage divider circuit divides the voltage of the output of the current limiter 423 or 424 to generate a second voltage to the inverted input of the inverter comparator $CMP_2$. When the second voltage is lower than the reference voltage Vref, the inverter comparator $CMP_2$ asserts the turn-on signal Tone.

Additionally, the outputs of the current limiters 425 and 426 are coupled to a third voltage divider circuit (not shown). In this case, the third voltage divider circuit divides the voltage of the output of the current limiter 425 or 426 to generate a third voltage to the inverted input of the inverter comparator $CMP_3$. When the third voltage is lower than the reference voltage Vref, the inverter comparator $CMP_3$ asserts the turn-on signal $Ton_3$.

Figure 5:
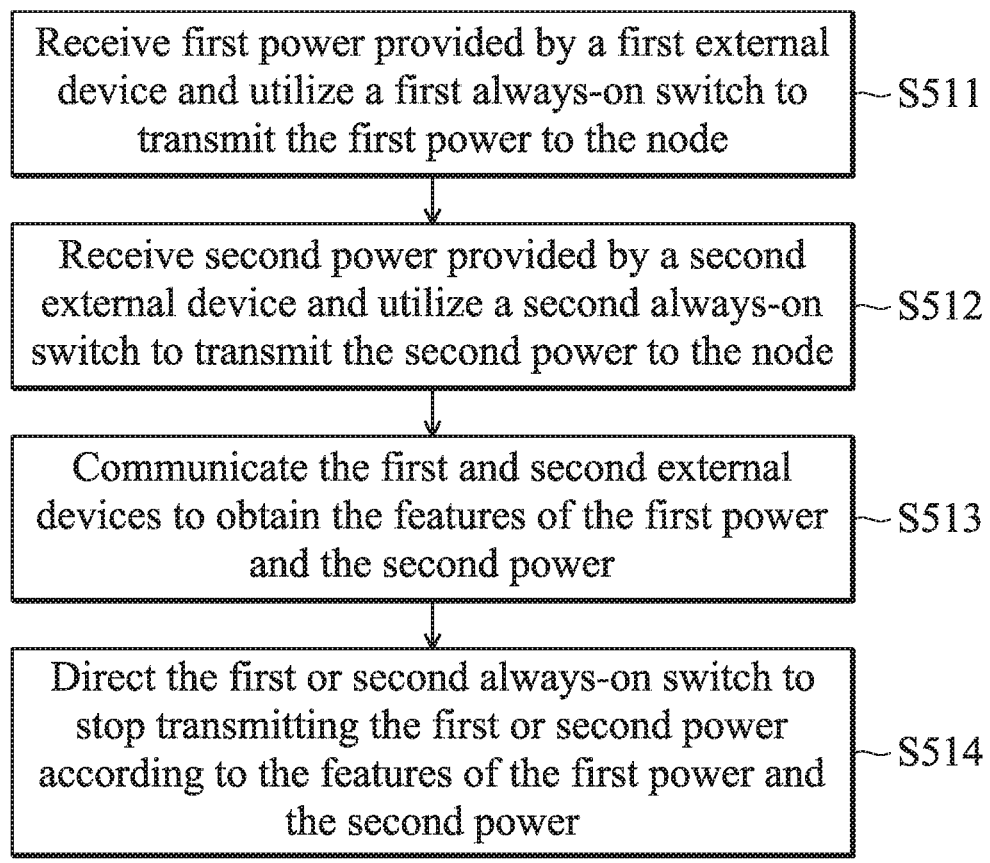
FIG. 5 is a flowchart diagram of an exemplary embodiment of a control method, according to various aspects of the present disclosure.

FIG. 5 is a flowchart diagram of an exemplary embodiment of a control method, according to various aspects of the present disclosure. The method in the present disclosure can be applied in the operating circuit 131 shown in FIGS. 1-4. First, first power provided by a first external device is received and a first always-on switch is utilized to transmit the first power to the node (step S511). Taking FIG. 1 as an example, the operating circuit 130 may utilize a USB port to receive the power $PW_1$, but the disclosure is not limited thereto. In other embodiments, the operating circuit 131 may utilize a DC jack to receive the power $PW_1$.

Second power provided by a second external device is received and a second always-on switch is utilized to transmit the second power to the node (step S512). Taking FIG. 1 as an example, the operating circuit 130 may utilize a USB port to receive the power $PW_2$, but the disclosure is not limited thereto. In another embodiment, the operating circuit 131 utilizes a DC jack to receive the power $PW_2$. In other embodiments, the operating circuit 131 may receive three or more power.

Step 513 is to communicate the first and second external devices to obtain the features of the first power and the second power. Taking FIG. 1 as an example, the operating circuit 130 may utilize a communication pin (e.g., the CC pin or the ID pin) of the USB port to communicate the first or second external device. In other embodiments, the operating circuit 130 may communicate with more external devices to obtain more features of the power provided from the external devices.

The first or second always-on switch is directed to stop transmitting the first or second power according to the features of the first power and the second power (step S514). In one embodiment, step S514 is to compare the first power and the second power. For example, when the first power is less than the second power, step S514 directs the first always-on switch to stop transmitting the first power. At this time, the second always-on switch still transmits the second power to the node. However, when the first power is greater than the second power, step S514 directs the second always-on switch to stop transmitting the second power. At this time, the first always-on switch still transmits the first power to the node. Since the first or second always-on switch still transmits power to the node, no enable signal provided from an external device outside of the operating circuit 130 is provided to the first or second always-on switch.

Furthermore, when the first always-on switch stops transmitting the first power and the second always-on switch still transmits the second power, if the second external device is removed or the second power is unstable, step S514 directs the first always-on switch to transmit first power to stabilize the operation of the subsequent circuit (e.g., the system circuit 132). In this case, step S514 may compare second power with a reference voltage. When the second power is lower than the reference voltage, it means that the second power is unstable. Therefore, step S514 directs the first always-on switch to transmit the first power to the node. Similarly, when the second always-on switch stops transmitting the second power and the first always-on switch still transmits the first power, if the first power is lower than the reference voltage, it means that the first power is unstable. Therefore, step S514 directs the second always-on switch to transmit the second power to the node. In one embodiment, step S514 utilizes two voltage divider circuits to divide the first power and the second power to generate a first voltage and a second voltage. In this case, step S514 compares the first or second voltage with the reference voltage.

In other embodiments, if the operating circuit 130 receive more power (e.g., first power, second power and third power), step S514 controls the corresponding always-on switch according to the features of the first power, the second power and the third power. Assuming that the first power is transmitted by a first always-on switch, the second power is transmitted by a second always-on switch, and the third power is transmitted by a third always-on switch. In such cases, when the first power is higher than the second power and the third power, step S514 directs the second always-on switch to stop transmitting the second power and directs the third always-on switch to stop transmitting the third power. When the second power is higher than the first power and the third power, step S514 directs the first always-on switch to stop transmitting the first power and directs the third always-on switch to stop transmitting the third power. When the third power is higher than the first power and the second power, step S514 directs the first always-on switch to stop transmitting the first power and directs the second always-on switch to stop transmitting the second power.

When an always-on switch transmits the corresponding power to the node, if the corresponding power is unstable, the voltage of the node is unstable enough to maintain the operation of the subsequent circuit. Therefore, when the voltage of the node is reduced to the threshold, step S514 turns on another always-on switch to provide stable power to the node.

For example, when the second power and the third power are lower than a reference voltage, step S514 directs the first always-on switch to transmit the first power to maintain the voltage of the node. When the first power and the third power are lower than the reference voltage step S514 directs the second always-on switch to transmit the second power. When the first power and the second power are lower than the reference voltage, step S514 directs the third always-on switch to transmit the third power. In some embodiments, step S514 utilizes three voltage divider circuits to divide the first power, the second power and the third power to generate three divided results. Then, step S514 compares the divided results with the reference voltage.

In other embodiments, step S514 may convert the voltage of the node to generate a converted voltage. In this case, the converted voltage serves as the reference voltage. In one embodiment, step S514 utilizes a voltage divider circuit to divide the voltage of the node and serves the divided result as the reference voltage.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the control methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:
1. An operating circuit comprising:
  a system circuit operating according to a voltage of a node; and
  a power control circuit comprising:
    a first connection port configured to receive first power provided by a first external device;
    a second connection port configured to receive second power provided by a second external device;
    a first always-on switch coupled to the first connection port to transmit the first power;
    a second always-on switch coupled to the second connection port to transmit the second power;
    a first current limiter coupled between the first always-on switch and the node to provide the first power to the node; and
    a second current limiter coupled between the second always-on switch and the node to provide the second power to the node, wherein in response to the first connection port being coupled to the first external device and the second connection port being coupled to the second external device, the system circuit communicates with the first and second external devices to obtain features of the first power and the second power and directs the first always-on switch to stop transmitting the first power or directs the second always-on switch to stop transmitting the second power according to the features of the first power and the second power.

2. The operating circuit as claimed in claim 1, wherein:
the first connection port comprises a first communication pin, and the system circuit communicates with the first external device via the first communication pin, and
the second connection port comprises a second communication pin, and the system circuit communicates with the second external device via the second communication pin.

3. The operating circuit as claimed in claim 2, wherein:
the system circuit communicates with the first external device via the first communication pin to generate a first turn-off signal, and the system circuit communicates with the second external device via the second communication pin to generate a second turn-off signal,
in response to the system circuit asserting the first turn-off signal, the first always-on switch stops transmitting the first power, and
in response to the system circuit asserting the second turn-off signal, the second always-on switch stops transmitting the second power.

4. The operating circuit as claimed in claim 1, further comprising:
a first inverter comparator generating a first turn-on signal according to the second power and a reference voltage;
a first switch controlling the first always-on switch according to the first turn-on signal;
a second inverter comparator generating a second turn-on signal according to the first power and the reference voltage; and
a second switch controlling the second always-on switch according to the second turn-on signal,
wherein:
in response to the first inverter comparator asserting the first turn-on signal, the first switch turns on the first always-on switch so that the first always-on switch transmits the first power, and
in response to the second inverter comparator asserting the second turn-on signal, the second switch turns on the second always-on switch so that the second always-on switch transmits the second power.

5. The operating circuit as claimed in claim 4, wherein in response to the second power being lower than the reference voltage, the first inverter comparator asserts the first turn-on signal, and in response to the first power being lower than the reference voltage, the second inverter comparator asserts the second turn-on signal.

6. The operating circuit as claimed in claim 4, further comprising:
a third connection port configured to receive third power provided by a third external device;
a third always-on switch coupled to the third connection port to transmit the third power; and
a third current limiter coupled between the third always-on switch and the node to provide the third power to the node,
wherein:
in response to both the second power and the third power being lower than the reference voltage, the first inverter comparator asserts the first turn-on signal, and
in response to both the first power and the third power being lower than the reference voltage, the second inverter comparator asserts the second turn-on signal.

7. The operating circuit as claimed in claim 6, further comprising:
a third inverter comparator generating a third turn-on signal according to the first power and the second power; and
a third switch controlling the third always-on switch according to the third turn-on signal,
wherein in response to both the first power and the second power being lower than the reference voltage, the third inverter comparator asserts the third turn-on signal so that the third always-on switch transmits the third power.

8. The operating circuit as claimed in claim 7, further comprising:
a fourth current limiter coupled between the second connection port and a first inverted input of the first inverter comparator;
a fifth current limiter coupled between the third connection port and the first inverted input;
a sixth current limiter coupled between the first connection port and a second inverted input of the second inverter comparator;
a seventh current limiter coupled between the third connection port and the second inverted input;
an eighth current limiter coupled between the first connection port and a third inverted input of the third inverter comparator; and
a ninth current limiter coupled between the second connection port and the third inverted input.

9. The operating circuit as claimed in claim 8, wherein the system circuit comprises:
a voltage converter circuit transforming the voltage of the node to generate a converted voltage; and
a voltage generating circuit generating the reference voltage according to the converted voltage.

10. The operating circuit as claimed in claim 9, further comprising:
a first voltage divider circuit coupled to the fourth and fifth current limiters to generate a first voltage to the first inverted input;
a second voltage divider circuit coupled to the sixth and seventh current limiters to generate a second voltage to the second inverted input;
a third voltage divider circuit coupled to the eighth and ninth current limiters to generate a third voltage to the third inverted input,
wherein:
in response to the first voltage being lower than the reference voltage, the first inverter comparator asserts the first turn-on signal,
in response to the second voltage being lower than the reference voltage, the second inverter comparator asserts the second turn-on signal, and
in response to the third voltage being lower than the reference voltage, the third inverter comparator asserts the third turn-on signal.

11. A control method comprising:
receiving first power from a first external device and utilizing a first always-on switch to transmit the first power to a node;

receiving second power from a second external device and utilizing a second always-on switch to transmit the second power to the node;

communicating with the first and second external devices to obtain features of the first power and the second power; and directing the first always-on switch to stop transmitting the first power or directing the second always-on switch to stop transmitting the second power according to the features of the first power and the second power.

12. The control method as claimed in claim 11, wherein the step of directing the first always-on switch to stop transmitting the first power or directing the second always-on switch to stop transmitting the second power according to the features of the first power and the second power comprises:

comparing the features of the first power and the second power, wherein in response to the first power being lower than the second power, the first always-on switch is directed to stop transmitting the first power to the node, and in response to the first power being higher than the second power, the second always-on switch is directed to stop transmitting the second power to the node.

13. The control method as claimed in claim 12, further comprising:

comparing the second power and a reference voltage, wherein in response to the second power being lower than the reference voltage, the first always-on switch is directed to transmit the first power to the node; and comparing the first power and the reference voltage, wherein in response to the first power being lower than the reference voltage, the second always-on switch is directed to transmit the second power to the node.

14. The control method as claimed in claim 11, further comprising:

receiving third power from a third external device;

utilizing a third always-on switch to transmit the third power to the node;

communicating the third external device to obtain features of the third power; and turning off two of the first, second and third always-on switches according to the features of the first power, the second power and the third power.

15. The control method as claimed in claim 14, wherein:

in response to the first power being higher than the second power and the third power, the second always-on switch is directed to stop transmitting the second power and the third always-on switch is directed to stop transmitting third power, in response to the second power being higher than the first power and the third power, the first always-on switch is directed to stop transmitting the first power and the third always-on switch is directed to stop transmitting third power, and in response to the third power being higher than the first power and the second power, the first always-on switch is directed to stop transmitting the first power and the second always-on switch is directed to stop transmitting second power.

16. The control method as claimed in claim 15, further comprising:

directing the first always-on switch to transmit the first power in response to both the second power and the third power being lower than a reference voltage, directing the second always-on switch to transmit the second power in response to both the first power and the third power being lower than the reference voltage, and directing the third always-on switch to transmit the third power in response to both the first power and the second power being lower than the reference voltage.

17. The control method as claimed in claim 16, further comprising:

utilizing a first voltage divider circuit to process either the second power or the third power to generate a first voltage, wherein in response to the second power being higher than the third power, the first voltage divider circuit processes the second power, and in response to the third power being higher than the second power, the first voltage divider circuit processes the third power, utilizing a second voltage divider circuit to process either the first power or the third power to generate a second voltage, wherein in response to the first power being higher than the third power, the second voltage divider circuit processes the first power, and in response to the third power being higher than the first power, the second voltage divider circuit processes the third power, and utilizing a third voltage divider circuit to process either the first power or the second power to generate a third voltage, wherein in response to the first power being higher than the second power, the third voltage divider circuit processes the first power, and in response to the second power being higher than the first power, the third voltage divider circuit processes the second power.

18. The control method as claimed in claim 17, wherein:

in response to the first voltage being lower than the reference voltage, the first always-on switch is directed to transmit the first power to the node, in response to the second voltage being lower than the reference voltage, the second always-on switch is directed to transmit the second power to the node, and in response to the third voltage being lower than the reference voltage, the third always-on switch is directed to transmit the third power to the node.

19. The control method as claimed in claim 11, further comprising:

converting a voltage of the node to generate a converted voltage; and generating the reference voltage according to the converted voltage.

* * * * *